United States Patent
Govindarajan et al.

(10) Patent No.: US 7,450,616 B2
(45) Date of Patent: Nov. 11, 2008

(54) AREA EFFICIENT SERIALIZER IMPLEMENTATION FOR SMALL FUNCTIONAL-TO-SERIAL CLOCK RATIOS

(75) Inventors: Subash Chandar Govindarajan, Tamil Nadu (IN); Sanjay Tanaji Shinde, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 794 days.

(21) Appl. No.: 10/754,216

(22) Filed: Jan. 9, 2004

(65) Prior Publication Data

US 2004/0165611 A1 Aug. 26, 2004

Related U.S. Application Data

(60) Provisional application No. 60/439,337, filed on Jan. 10, 2003.

(51) Int. Cl.
*H04J 3/06* (2006.01)
(52) U.S. Cl. ........................ 370/503; 370/506; 370/512; 370/514; 375/354; 375/365; 375/368
(58) Field of Classification Search ................. 370/514, 370/366, 412
See application file for complete search history.

(56) References Cited

U.S. PATENT DOCUMENTS

| | | | | |
|---|---|---|---|---|
| 5,167,019 A * | 11/1992 | Fava et al. | .................. | 709/240 |
| 5,636,208 A * | 6/1997 | Chang et al. | ................. | 370/347 |
| 5,726,990 A * | 3/1998 | Shimada et al. | ............. | 370/536 |
| 6,427,179 B1 * | 7/2002 | Amrany et al. | ................. | 710/64 |
| 6,442,178 B1 * | 8/2002 | Arato et al. | .................. | 370/506 |
| 6,487,210 B1 * | 11/2002 | Janoska et al. | .............. | 370/412 |
| 6,643,716 B2 * | 11/2003 | Hunsaker et al. | .............. | 710/21 |
| 6,738,389 B1 * | 5/2004 | Arato | ......................... | 370/466 |
| 7,003,060 B2 * | 2/2006 | Naka et al. | ................... | 375/354 |
| 2003/0070127 A1 * | 4/2003 | Kusko et al. | ................ | 714/726 |

* cited by examiner

*Primary Examiner*—Chirag G Shah
*Assistant Examiner*—Salvador E Rivas
(74) *Attorney, Agent, or Firm*—Robert D. Marshall, Jr.; W. James Brady; Frederick J. Telecky, Jr.

(57) ABSTRACT

This invention adds one extra bit which can be viewed as a shadow of most significant bit of the serial register. This extra register bit is referred as buffer_flop. When the receive data is coming in, the data bits keep shifting into the serial register of the serializer block bit by bit. The first bits enters into the most significant bit of the serial register and is shifted towards the least significant bit of the serial register. When a whole block of bits (32 bits) are received, the serializer is full and is read into the VBUS clock domain. The first bit of next block of bits is stored in the buffer flop. The second bit is stored in the most significant bit of the serializer and the buffer flop bit is copied into the second most significant bit of the serializer. Subsequent bits are received and right shifted by one.

3 Claims, 1 Drawing Sheet

US 7,450,616 B2

AREA EFFICIENT SERIALIZER IMPLEMENTATION FOR SMALL FUNCTIONAL-TO-SERIAL CLOCK RATIOS

CLAIM OF PRIORITY

This application claims priority under 35 U.S.C. 119(e)(1) from U.S. Provisional Application No. 60/439,337 filed Jan. 10, 2003.

TECHNICAL FIELD OF THE INVENTION

The technical field of this invention is multichannel serial ports.

BACKGROUND OF THE INVENTION

A multichannel serial port designed as part of a peripheral design reuse module, supports plural serializers. Each of these serializers is individually programmable as either a transmitter or a receiver. In the receive mode, the serial data comes from an external source into the serializer which is clocked by a slow serial clock. When a block of data, such as 32 bits, is received, the data is transferred into VBUS clock domain. The VBUS clock domain has a clock that is an integral fraction of the central processing unit clock. This data is read by the central processing unit from the VBUS clock domain. A synchronizer is required between the serial clock domain and the VBUS clock domain. To optimize integrated circuit area, typically the data is not synchronized but the control (load enable) is synchronized. This load enable signal is used in the VBUS clock domain to latch the data from the serializer.

Since the receive data continues to come, the data in the serializer must be read before it gets over written by the next incoming serial data bit. This poses a clock ratio limitation of about 3 to 1 for VBUS to serial clock. When the device is run at a slower clock, meaning that the VBUS clock frequency is low, it may be impossible to meet this ratio limitation. Thus there is a need in the art for a serializer capable of operation with a clock ratio of less than 3 to 1.

There are two alternate ways of achieving this in the known art. It is possible to provide a shadow register of 32 bits wide, shadowing the whole serializer register. At the end of receiving a block of 32 bits of data, this shadow register stores the same value as the serial register. Shifting within this shadow register can be disabled so that this retains the data till the register is read into VBUS clock domain. Once read, the serial register can be shadowed into this shadow register. This method requires an additional serial shift register having the data block length, equivalent to an additional serializer register. A second method is to synchronize the 32 bit data rather than the load enable signal. This method requires at least two flip flops for each data bit in the data block. This is equivalent to two additional serializer registers. Thus these prior art solutions require additional circuits as large or larger than the original serializer.

SUMMARY OF THE INVENTION

This invention adds one extra bit which can be viewed as a shadow of most significant bit of the serial register. This extra register bit is referred as buffer_flop. When the receive data is coming in, the data bits keep shifting into the serial register of the serializer block bit by bit. The first bits enters into the most significant bit of the serial register and is shifted towards the least significant bit of the serial register. When a whole block of bits (32 bits) are received, the serializer is full and is read into the VBUS clock domain. The first bit of next block of bits is stored in a shadow register (buffer flop). When the second bit is received it gets stored in the most significant bit of the serializer and the shadow register bit is copied into the next most significant bit of serializer. When third to thirty second bits are received, the received bit gets stored in the most significant bit of the serializer while the previously stored data gets right shifted by one. That is the previous value of most significant bit becomes current value of second most significant bit. The previous value of the second most significant bit becomes current value of the third most significant bit and so on till all 32 bits of the block are received.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
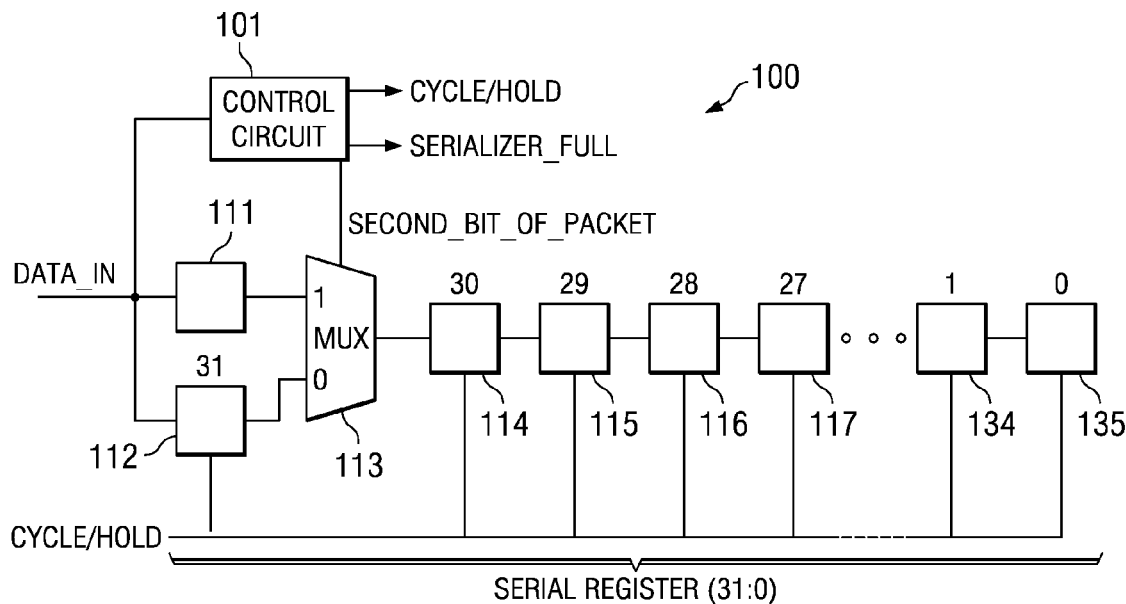
FIG. 1 illustrates the serializer shift register of this invention.

FIG. 1 illustrates serial shift register 100 employed in the serialization of this invention. Upon receipt of the first bit of a packet, control circuit 101 disabled the shift operation of shift register 100 via cycle/hold signal in hold mode. The serializer stores the old data. This first bit is written into buffer_flop 111. Thus the new value of serial register (31:0) is same as old value and the just received new data bit is stored in buffer_flop 111. The outputs of bit flip-flops 112 and 114 to 135 are connected to respective inputs of register 200 in the VBUS clock domain (see FIG. 2). FIG. 1 does not illustrate the connections for clarity.

When the second data bit is received it is written into the most significant bit 112 of the serial register. Control circuit 101 supplies cycle/hold signal in cycle mode. The value stored in buffer_flop 111 is copied into the next bit 114 of the serial register via multiplexer 113 as controlled by the second_bit_of_packet signal from control circuit 101. Since this is the second bit of the block, multiplexer 113 selects the output of buffer_flop 111. Thus the new value of most significant bit 112 is received data bit and the new value of bit 114 is the prior contents of buffer_flop 111. The rest of the data shifts right. The new values of bits 115 to 135 are the old values of the next most significant bits according to the cycle mode.

When the third bit is received, it is written into most significant bit 112. Control circuit 101 continues to generate the cycle/hold signal in cycle mode. The rest of serial register bits shift right. Thus the new value of most significant bit 112 is the received data bit. Because this is not the second bit of the block, multiplexer 113 selects the output of most significant bit 112 to supply to bit 114. The new values of bits 114 to 135 are the old values of the next most significant bits. This process is repeated for the fourth and subsequent bits within the block.

Figure 2:
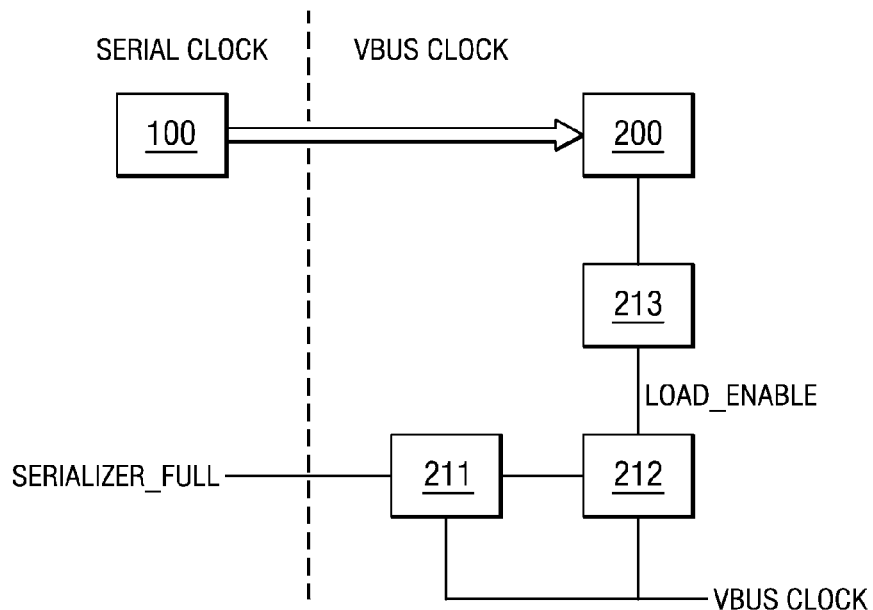
FIG. 2 illustrates the serializer shift register and the register in the VBUS clock domain.

At the end of packet, 32 bits of data are available in the serializer. Control circuit 101 generates a serializer_full signal in the serial clock domain. As illustrated in FIG. 2, this is synchronized to the VBUS clock via serially connected flip-flops 211 and 212 which are clocked by the VBUS clock. The synchronized load_enable passes through rising edge detect circuit 213 which generates a pulse of width equal to one VBUS clock on detecting rising edge of the synchronized load enable (output of 212). This pulse causes the VBUS clock domain to latch the serial register 100 data into the VBUS clock domain to latch the serial register 100 data into the VBUS clock domain register 200. Serial register 100 should not be over written before this read into VBUS clock domain register 200. In this invention the first bit received does not overwrite the serial register data. This allows reading into VBUS clock domain register 200 before two clock periods of serial clock, that is before the second bit is received into serial register 100. In the absence of buffer_flop 111 and the timing of this invention, the data would have to be read within one serial clock period, that is before the first bit is received. This invention requires three VBUS clocks, two for the synchronizer and one more for latching into the VBUS domain, for proper reading. Hence, this invention needs only three VBUS clocks in a two serial clock period. This reduces the clock ratio limitation to 1.5 to 1 for VBUS clock to serial clock.

The invention requires fewer circuits and thus less integrated circuit area than the prior solutions described above. This invention requires one additional flip flop, the buffer_flop. Our implementation results in a saving of 31 flip-flops per serializer over the prior method of shadowing the entire serializer register. This serializer block could be instantiated many times single integrated circuit. Besides achieving a significant area reduction over the prior art, this invention would consume less power because it uses fewer flip flops.

What is claimed is:

1. A data serializer comprising:
    a input terminal receiving serial bits of data in data blocks of N bits;
    a buffer-flip-flop having an input connected to input terminal and an output for storing a bit received at said input;
    a most significant bit flip-flop having an input connected to said input terminal, an output and a hold terminal for storing a bit received at said input;
    a multiplexer having a first input connected to said output of said buffer-flip-flop, a second input connected to said output of said most significant bit flip-flop, a control input and an output, said multiplexer selectively outputting one of said first input or said second input corresponding to a control signal at said control input;
    a serial chain of N−1 bit flip-flops, each bit flip-flop having a input connected to an output of a prior bit flip-flop in said serial chain for storing a bit received at said input, a first bit flip-flop of said serial chain having an input connected to said output of said multiplexer, said serial chain of N−1 bit flip-flops including a cycle input initialing transfer of data from each bit flip-flop of said serial chain of N−1 bit flip-flops to a next bit flip-flop in said serial chain;
    a multibit register having N parallel bit inputs, a most significant bit input connected to said output of said most significant bit flip-flop, N−1 less significant bit input connected to respective outputs of said serial chain of N−1 bit flip-flops, and a load enable input, said multibit register storing bits received at said N parallel bit input upon a load enable signal at said load enable input;
    a control circuit connected to said input terminal, said most significant bit flip-flop, multiplexer having a first input connected to said output of said buffer-flip-flop, a second input connected to said output of said most significant bit flip-flop, a control input and an output, said multiplexer, said serial chain of N−1 bit flip-flops and said multibit register, said control circuit
        on a first bit of a data block, storing said first bit of said data block in said buffer-flip-flop and holding data in said most significant bit register and said serial chain of N−1 bit flip-flops,
        on a second bit of a data block, supplying a control signal to said multiplexer to select said first input and supplying a cycle signal to said cycle input of said serial chain of N−1 bit flip-flops for transferring data from each bit flip-flop of said serial chain of N−1 bit flip-flops to a next bit flip-flop in said serial chain,
        on bits of a data block other than a first, second or last bit, supplying a control signal to said multiplexer to select said second input and supplying a cycle signal to said cycle input of said serial chain of N−1 bit flip-flops for transferring data from each bit flip-flop of said serial chain of N−1 bit flip-flops to a next bit flip-flop in said serial chain, and
        on a final bit of a data block supplying a load enable signal to said load enable input of said multibit register.

2. The data serializer of claim 1, wherein:
    said buffer-flip-flop, said most significant bit flip-flop, said multiplexer, said serial chain of N−1 bit flip-flops and said control circuit are disposed in a first clock domain clocked by a serial input clock;
    said multibit register is disposed in a second clock domain clocked by a second clock;
    said second clock domain further including a synchronizer having an input connected to said control circuit receiving a serializer_full signal upon a final bit of a data block, a clock input connected to said second clock and an output supplying said load enable signal to said load enable input of said multibit register.

3. The data serializer of claim 2, wherein: said synchronizer includes
    a first flip-flop having a data input receiving said serializer_full signal, a clock input receiving said second clock and an output, said first flip-flop storing and outputting a signal received at said data input upon each receipt of a clock signal at said clock input, and
    a second flip-flop having a data input connected to said output of said first flip-flop, a clock input receiving second input clock and an output forming said load enable signal, said second flip-flop storing and outputting a signal received at said data input upon each receipt of a clock signal at said clock input.

* * * * *